(12) United States Patent
Oster et al.

(10) Patent No.: US 10,734,236 B2
(45) Date of Patent: Aug. 4, 2020

(54) ELECTRONIC DEVICES WITH COMPONENTS FORMED BY LATE BINDING USING SELF-ASSEMBLED MONOLAYERS

(71) Applicant: INTEL CORPORATION, Santa Clara, CA (US)

(72) Inventors: Sasha N. Oster, Chandler, AZ (US); Fay Hua, Fremont, CA (US); Telesphor Kamgaing, Chandler, AZ (US); Adel A. Elsherbini, Chandler, AZ (US); Henning Braunisch, Phoenix, AZ (US); Johanna M. Swan, Scottsdale, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/399,703

(22) Filed: Apr. 30, 2019

(65) Prior Publication Data
US 2019/0259622 A1    Aug. 22, 2019

Related U.S. Application Data

(63) Continuation of application No. 15/476,842, filed on Mar. 31, 2017, now Pat. No. 10,304,686.

(51) Int. Cl.
*H01L 21/4763* (2006.01)
*H01L 21/285* (2006.01)
(Continued)

(52) U.S. Cl.
CPC ........ *H01L 21/28562* (2013.01); *B82Y 40/00* (2013.01); *H01L 21/033* (2013.01);
(Continued)

(58) Field of Classification Search
CPC . H01L 2924/00014; H01L 2224/05111; H01L 2224/05124; H01L 2224/05139;
(Continued)

(56) References Cited

U.S. PATENT DOCUMENTS 9,824,962 B1   11/2017  Hua et al.
10,304,804 B2   5/2019  Hua et al.
(Continued)

OTHER PUBLICATIONS

U.S. Appl. No. 15/279,708, filed Sep. 29, 2016, Invented by Hua et al., issued as U.S. Pat. No. 9,824,962.
(Continued)

*Primary Examiner* — Robert G Bachner
(74) *Attorney, Agent, or Firm* — Konrad Raynes Davda & Victor LLP; Alan S. Raynes

(57) ABSTRACT

Embodiments include devices and methods, including a method for processing a substrate. The method includes providing a substrate including a first portion and a second portion, the first portion including a feature, the feature including an electrically conductive region, the second portion including a dielectric surface region. The method also includes performing self-assembled monolayer (SAM) assisted structuring plating to form a structure comprising a metal on the dielectric surface region, the feature being formed using a process other than the SAM assisted structuring plating used to form the structure, and the structure being formed after the feature. Other embodiments are described and claimed.

20 Claims, 11 Drawing Sheets

US 10,734,236 B2
Page 2

(51) Int. Cl.

| | | |
|---|---|---|
| *H01L 21/768* | (2006.01) | |
| *H01L 21/033* | (2006.01) | |
| *B82Y 40/00* | (2011.01) | |
| *H01L 23/66* | (2006.01) | |
| *H01L 25/16* | (2006.01) | |
| *H05K 1/16* | (2006.01) | |
| *H05K 3/28* | (2006.01) | |
| *H01L 23/538* | (2006.01) | |
| *H01L 21/48* | (2006.01) | |
| *H05K 1/02* | (2006.01) | |
| *H05K 3/34* | (2006.01) | |

(52) U.S. Cl.
CPC ...... *H01L 21/4763* (2013.01); *H01L 21/4857* (2013.01); *H01L 21/76822* (2013.01); *H01L 21/76834* (2013.01); *H01L 23/5383* (2013.01); *H01L 23/66* (2013.01); *H01L 25/16* (2013.01); *H05K 1/165* (2013.01); *H05K 3/282* (2013.01); *H01L 21/76876* (2013.01); *H01L 2223/6677* (2013.01); *H05K 1/0298* (2013.01); *H05K 3/341* (2013.01); *H05K 2201/10098* (2013.01)

(58) Field of Classification Search
CPC . H01L 2224/05144; H01L 2224/05147; H01L 2224/05155; H01L 2224/05611; H01L 2224/05624; H01L 2224/05639; H01L 2224/05644; H01L 2224/05647; H01L 2224/05655; H01L 2224/48091; H01L 2224/48247; H01L 2924/12041; H01L 2924/13091; H01L 2924/181; H01L 2924/00; H01L 2924/00012; H01L 2924/30105; H01L 21/02164; H01L 21/02181; H01L 21/0228; H01L 21/31111; H01L 21/481; H01L 21/4846; H01L 21/6835; H01L 2221/68327; H01L 2221/6834; H01L 2224/0401; H01L 2224/04042; H01L 2224/11849; H01L 2224/13022; H01L 2224/16235; H01L 2224/27452; H01L 2224/27614; H01L 2224/29187; H01L 2224/32135; H01L 2224/83896; H01L 2225/06531; H01L 23/481; H01L 23/5223; H01L 23/5227; H01L 23/5228; H01L 23/552; H01L 23/642; H01L 24/11; H01L 24/13; H01L 24/27; H01L 24/32; H01L 24/83; H01L 25/0657; H01L 25/50; H01L 27/016; H01L 27/14618; H01L 2924/01072; H01L 2924/01078; H01L 2924/01079; H01L 2924/01322; H01L 2924/0534; H01L 2924/05442; H01L 2924/14; H01L 2924/1433; H01L 2924/15174; H01L 2924/15311; H01L 2924/19011; H01L 2924/19041; H01L 2924/19042; H01L 2924/19043; H01L 2924/3025; C23C 18/165; C23C 18/2006

See application file for complete search history.

(56) References Cited

U.S. PATENT DOCUMENTS

| | | |
|---|---|---|
| 2009/0239331 A1 | 9/2009 | Xu et al. |
| 2010/0065942 A1 | 3/2010 | Lin et al. |
| 2011/0194260 A1 | 8/2011 | Jung et al. |
| 2013/0105967 A1 | 5/2013 | Lee et al. |
| 2015/0255372 A1 | 9/2015 | Kamgaing |
| 2017/0092620 A1 | 3/2017 | Haba et al. |
| 2017/0154790 A1 | 6/2017 | Hua et al. |
| 2018/0096975 A1 | 4/2018 | Hua et al. |
| 2018/0098428 A1 | 4/2018 | Hua et al. |
| 2018/0286687 A1 | 10/2018 | Oster et al. |
| 2018/0286834 A1 | 10/2018 | Hua et al. |

OTHER PUBLICATIONS

U.S. Appl. No. 15/282,473, filed Sep. 30, 2016, Invented by Hua et al., published as US 20180096975.
Pending U.S. Appl. No. 15/283,352, filed Oct. 1, 2016, Invented by Hua et al., published as US 20180098428.
U.S. Appl. No. 15/476,872, filed Mar. 31, 2017, Invented by Hua et al., issued as U.S. Pat. No. 10,304,804.
"Molecular Self-Assembly", Material Matters, Sigma-Aldrich, vol. 1, No. 2 (2006), pp. 1-5.
Wikipedia, "Self-assembled monolayer", [online] Last Modified on Jun. 30, 2016, [Retrieved on Nov. 29, 2016], Retrieved from the Internet at <URL: http://en.wikipedia.org/wiki/Self-assembled_monolayer, 12 pp.
Office Action 1 for U.S. Appl. No. 15/476,842, dated Sep. 14, 2018, 25 pp. [77.380 (OA1)].
Response to Office Action 1 for U.S. Appl. No. 15/476,842, dated Dec. 14, 2018, 9 pp. [77.380 (ROA1)].
Notice of Allowance 1 for U.S. Appl. No. 15/476,842, dated Jan. 15, 2019, 7 pp. [77.380 (NOA1)].
Office Action 1 for U.S. Appl. No. 15/476,872, dated Nov. 20, 2017, 22 pp. [77.381 (OA1)].
Response to Office Action 1 for U.S. Appl. No. 15/476,872, dated Feb. 20, 2018, 10 pp. [77.381 (ROA1)].
Final Office Action 1 for U.S. Appl. No. 15/476,872, dated May 2, 2018, 15 pp. [77.381 (FOA1)].
Response to Final Office Action 1 for U.S. Appl. No. 15/476,872, dated Jul. 2, 2018, 9 pp. [77.381 (RFOA1)].
Notice of Allowance 1 for U.S. Appl. No. 15/476,872, dated Sep. 25, 2018, 8 pp. [77.381 (NOA1)].
Notice of Allowance 2 for U.S. Appl. No. 15/476,872, dated Jan. 30, 2018, 13 pp. [77.381 (NOA2)].
U.S. Appl. No. 16/399,726, filed Apr. 30, 2019, Invented by Hua et al., 26 pp. [77.381C1 (Appln)].
Preliminary Amendment for U.S. Appl. No. 16/399,726, filed Apr. 30, 2019, 6 pp. [77.381C1 (PrelimAmend)].
Office Action 1 for U.S. Appl. No. 16/399,726 dated Dec. 30, 2019, 15 pp. [77.381C1 (OA1)].

ELECTRONIC DEVICES WITH COMPONENTS FORMED BY LATE BINDING USING SELF-ASSEMBLED MONOLAYERS

This application is a continuation of U.S. patent application Ser. No. 15/476,842, filed Mar. 31, 2017, which is incorporated herein by reference in its entirety.

TECHNICAL FIELD

Embodiments relate to devices and processes to form devices including the use of self-assembled monolayers (SAMs) to form structures thereon.

BACKGROUND

A common issue during assembly of electronic devices is a change in components late in the design cycle or the need for different types of components in the same product.

One approach for addressing this problem is to have multiple footprints on a substrate, with each of the footprints configured to fit a particular component during final assembly and each of the footprints being electrically coupled to the die field so that during assembly the desired component can be positioned on the selected footprint region. Such an approach results in unused area on the board (the footprint region(s) that are not used) and can lead to potential signal integrity issues where the open lines in an unused footprint region can impact the signal quality.

BRIEF DESCRIPTION OF THE DRAWINGS

Embodiments are described by way of example, with reference to the accompanying drawings, in which like reference numerals may refer to similar elements.

DESCRIPTION OF EMBODIMENTS

References in the specification to "embodiments," "certain embodiments," "an embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to the formation of devices including a substrate such as a printed circuit board or microelectronic package that includes a self-assembled monolayer (SAM) region where conductive structures are formed.

Electronic devices such as packages containing electronic components may take many months to be designed and fabricated. As a result, it is desired to determine the final design as early as possible. This allows very little flexibility and can lead to problems if one wants to substitute a part or make a variation to the design later in the design cycle or a requirement to have different configurations of a product, including, for example, different sensors for a wearable product, or different types of flash memory on a SiP (system in package). For example, sensors come in a wide variety of footprints, but often employ similar communication protocols with the microprocessor. Many sensors use I2C (Inter-Integrated Circuit) or SPI (Serial Peripheral Interface) protocols, which may utilize two or four electrical connections. One may want to design a package to use an accelerometer sensor, but may not know the exact type or its exact footprint until late in the design and manufacturing process. Alternatively, one may know the type of sensor, but may want to be able to choose between different sensors of that type on the package.

Certain embodiments relate to methods and structures that permit a product such as a package to be fabricated early in the design cycle, but which allows great flexibility for forming the final routing and footprint in certain regions of the package. In certain embodiments, this may be accomplished by performing a late binding process utilizing a self-assembled monolayer (SAM), together with formation of a metal layer thereon.

Figure 1A:
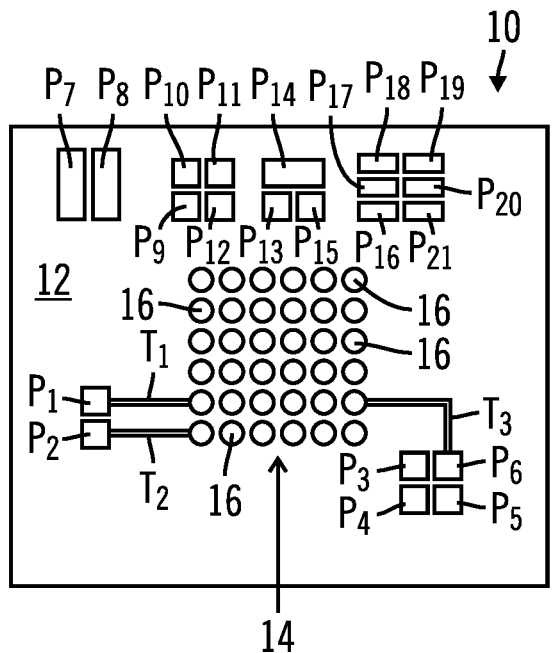
FIG. 1A illustrates a substrate including a die field and a plurality of footprint regions, in accordance with certain embodiments.

FIG. 1A illustrates a view of a surface of a body or substrate 10 such as, for example, a printed circuit board or microelectronic package, in accordance with certain embodiments, including a surface 12 having a die field 14 including a plurality of pads 16 on which a die (also known as a chip) will be positioned. A number of features in addition to the pads 16 in the die area may also be positioned on the surface 12, including, but not limited to, pads, traces, inductors, capacitors, resistors, crystal oscillators, and other passive or active features. For example, a capacitor may be positioned on pads P1 and P2 on the surface 12 and electrically coupled to two pads 16 in the lower left portion of the die field 14 through traces T1 and T2, and a crystal oscillator may be positioned on pads P3, P4, P5, and P6 and on the surface 12 and electrically coupled to a pad 14 in the die field through trace T3 or one or more other traces.

FIG. 1A also illustrates various pad configurations towards the top portion of the figure on surface 12. The various pad configurations are for different components, for example, sensors or memory, that may be positioned on the surface 12. In one example, at the time of the initial package design, the exact sensor to be used may not have been determined, and there are a variety of sensors that can be used depending on the exact product. The product may in certain embodiments be a cellular telephone. Depending on the particular phone model, different sensors (including, but not limited to, a temperature sensor, accelerometer, gyroscope, light sensor, magnetometer, proximity sensor, barometer, air humidity sensor, pedometer, heart rate monitor, fingerprint sensor, gas sensor, and radiation sensor) may be included. The various sensors may have different footprints that utilize different pad layouts on the surface 12. FIG. 1A illustrates four different sensor footprints near the top portion of the figure on surface 12, including one with two pads P7-P8, one with three pads P9-P11, one with four pads P12-P15, and one with six pads P16-P21.

The die field 14 and the pads P1-P21 may all be formed during the initial formation of the device, using a suitable process. One such process is as follows: First a multilayer substrate including layers of dielectric material and electrically conductive pathways within the substrate is formed. The pads 16 in the die field 14, the pads P1-P21, and the traces T1-T3 may be formed by depositing a seed layer of a conductive material on a dielectric layer (surface 12), followed by a patterning of a mask within an opening defining the various pads and traces. An electrolytic plating process is then carried out to deposit an electrically conductive material such as copper on the seed layer in the openings in the mask. The mask is then removed and the unwanted seed layer is removed (for example, by etching), resulting in the formation of the various pads and traces on the surface 12 illustrated in FIG. 1A. Depending on the number of layers, a number of deposition, masking, and etching operations may be carried out. Other suitable processes may also be used.

At a later time in the product lifecycle, the manufacturer or the customer will decide the exact sensor(s) desired. As seen in FIG. 1A, the package includes four sensor pad regions that can accommodate a variety of sensors thereon. For example, the pads P7-P8 can accommodate a sensor that utilizes two electrical contacts, the pads P9-P12 can accommodate a sensor that utilizes four electrical contacts, the pads P13-P15 can accommodate a sensor that utilizes three electrical contacts, and the pads P16-P21 can accommodate a sensor that utilizes six electrical contacts. At this point, none of these sensor pads regions (pads P7-P21) have been electrically coupled to any of the pads 16 in the die field 14 on the surface 12 (though there could be an electrical path at another layer of the device). If multiple connections from different sensor pad regions are made to a common pad 16 in the die field 14, any unused connections may lead to signal interference concerns and the like.

Figure 1B:
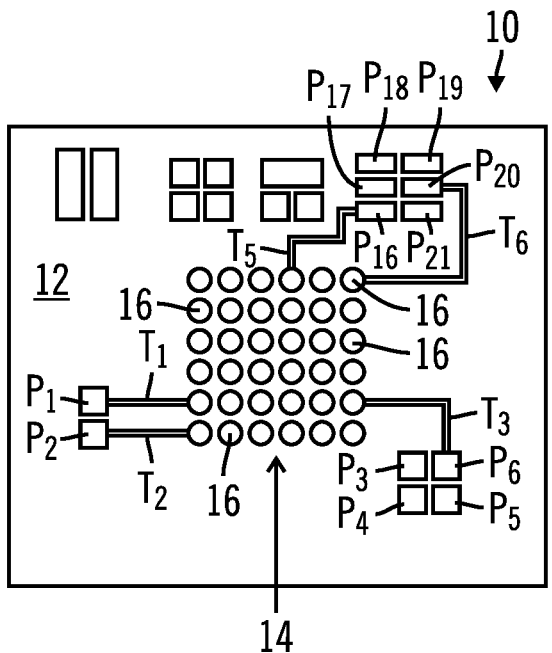
FIG. 1B illustrates the substrate of FIG. 1A, including traces to a footprint region, in accordance with certain embodiments.

As illustrated in FIG. 1B, the traces T5 and T6 may be formed to electrically couple the pads P16 and P20 to pads 16 in the die field 14. The traces T5 and T6 may be formed using a late binding process such as a self-assembled monolayer (SAM) assisted structuring process, an example of which is described below after the discussion of FIGS. 2A-2B.

Figure 2A:
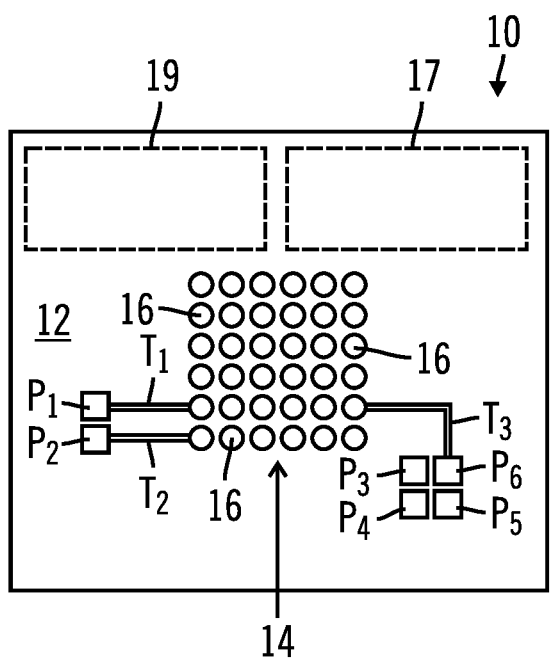
FIG. 2A illustrates a substrate including a die field and a late binding area, in accordance with certain embodiments.

FIG. 2A illustrates a configuration in some ways similar to that illustrated in FIG. 1A, including a body 10 such as, for example, a printed circuit board or a package substrate, including a surface 12 having a die field 14 including a plurality of pads 16 on which a die will be positioned. As in FIG. 1A, a variety of features are positioned on the surface 12. However, instead of having preformed pad regions that can accommodate different sensors, and later selecting which pad regions to use in a late binding operation to form traces coupling the selected pads regions to pads in the die field, certain embodiments in accordance with FIGS. 2A-2B include a sensor region 17 in which the pads and traces are both formed using a late binding operation, and a region 19 that can be used for any desired purpose. Unlike FIG. 1B, where part of the surface 12 includes a region including pads P7-P15 that are unused (because a sensor that fits with pads P16-P21 was selected), in FIGS. 2A-2B, the region 19 provides additional real estate that is not available in the embodiment illustrated in FIG. 1B. By late forming both the sensor pads and traces, a substantial amount of real estate can be saved and used for other features.

Figure 2B:
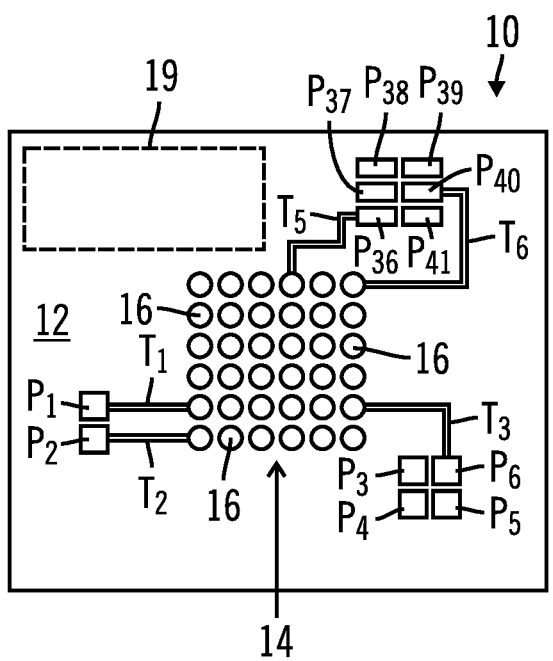
FIG. 2B illustrates the substrate of FIG. 2A, including traces and pads in the late binding area, in accordance with certain embodiments.

As illustrated in FIG. 2B, a similar sensor configuration may be selected as in FIG. 1B. In FIG. 2B, however, the pads P36-P41 and traces T5 and T6 are late formed. While the pads P36-P41 may be positioned in a similar location and have a similar layout as the pads P16-P21 in FIG. 1B, the pads P36-P41 are formed using a late binding process such as that described below.

A method of late forming a metallization structure on a substrate such as a printed circuit board, a microelectronic package substrate, or an integrated circuit, in accordance with certain embodiments, is described. Using a self-assembled monolayer (SAM) assisted structuring process, a metallization structure including, but not limited to, a conductive trace or pad, may be formed on a dielectric material (such as a polymer) by bonding a conductive material to the dielectric material through a self-assembled monolayer (SAM). A SAM assisted structuring process may include activating an area of a dielectric material such as a polymer with electromagnetic radiation, then modifying the active area, then forming a SAM on the modified activated area, then reacting the SAM with a catalyst, then reacting the SAM that was reacted with a catalyst with a conductive material. In one embodiment, an area of a polymer layer on a substrate is activated using, for example, electromagnetic radiation. The operations may also include modifying the activated area, forming a self-assembled monolayer on the modified active layer, reacting the self-assembled monolayer with a catalyst, and reacting the catalyzed self-assembled monolayer with a metal. The resultant metal structure formed may be chemically bonded to the self-assembled monolayer through the catalyst, and thus bonded to the underlying dielectric material.

Figure 3:
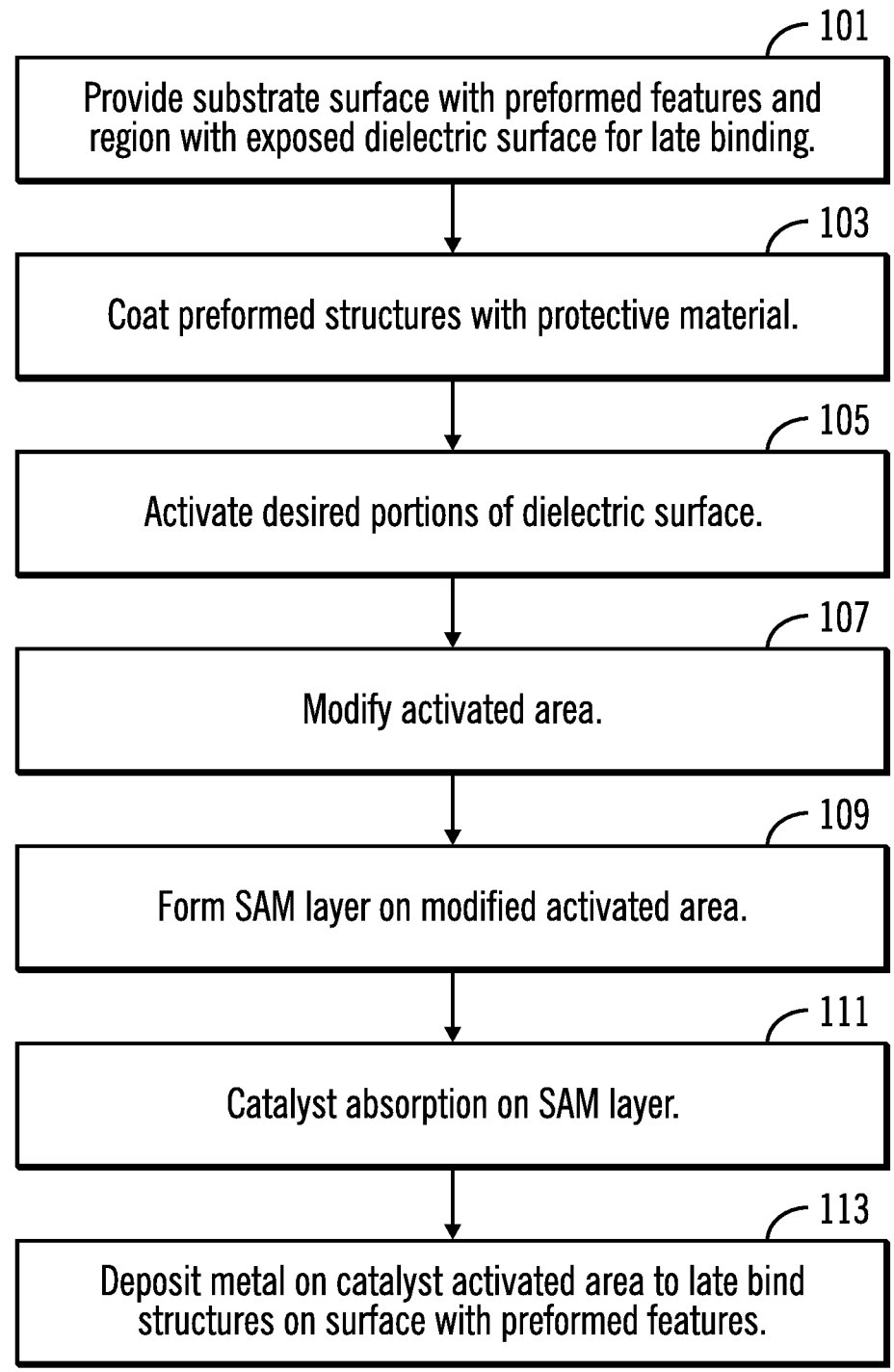
FIG. 3 illustrates a flowchart of operations, in accordance with certain embodiments.

FIG. 3 illustrates a flowchart of a method for late binding metallized structures on a substrate having certain preformed features thereon, such as illustrated in FIGS. 1A-1B and 2A-2B, using a self-assembled monolayer (SAM) assisted structuring process, in accordance with certain embodiments. Box 101 is providing a substrate including a plurality of preformed structures or features thereon, including, but not limited to, traces and pads. The substrate includes a dielectric surface region on which it is desired to perform late binding of features including electrically conductive metallized structures. The dielectric surface region may be formed from a material including, but not limited to, a polymer such as an epoxy or other resin, for example, a laminateable build-up film or a liquid crystal polymer. In certain embodiments, the dielectric material may comprise a laminate dielectric layer. A laminate dielectric layer includes a dielectric film that is prefabricated and may be attached to a surface by using an adhesive (e.g. glue) or heating and pressing onto a surface. Chemical adhesive promoters may also be used to attach the dielectric film to another surface. The use of a laminate dielectric layer enables the formation of a relatively uniform thickness dielectric layer. Certain embodiments may utilize a laminate dielectric layer having a thickness of about 2 microns to about 100 microns. In certain embodiments, multiple film layers may be used to make up a laminate dielectric layer. Other types of dielectric layers may have problems due to high cost (CVD) and/or inability to form a layer of acceptable thickness uniformity across its area (spin-on).

Box 103 is coating the preformed structures with protective material, if desired, to shield them during subsequent processing including the late binding operations.

Box 105 includes activating the desired area for the late binding of structures by exposure, for example, to electromagnetic radiation such as ultraviolet (UV) laser radiation. It is believed that the activation serves to break or otherwise disassociate bonds in the polymer layer. In certain embodiments, activation may be carried out as follows. First, the substrate is positioned on a stage. A pulsed-wave ultraviolet (UV) laser is connected to a servomechanism that controls a mechanical position in at least an XZ direction of the laser. The laser may direct electromagnetic radiation in the form of a beam to a galvanometer that steers the beam towards the substrate on the stage. In one embodiment, the laser may have a wavelength of 355 nanometers and a power of 0.904 watts at 29 amps. A width of the beam may in certain embodiments be similar to a width of a desired line of trace to be patterned on a polymer region on the substrate. A mirror may be disposed between the galvanometer and stage to collimate the radiation. The system may be computer controlled, and may include a Drawing eXchange Format (DXF) file or the like, of a pattern for a specific substrate for locating the regions to be treated.

Box 107 of FIG. 3 is modifying the activated area. This may, in certain embodiments, be carried out by performing hydrolysis to form OH (hydroxyl) rich areas on the activated portion of the substrate. This may be carried out by exposing the activated area to water such as by placing the substrate or a portion thereof into a tank of water to allow hydroxyl moieties to react or otherwise bond with the activated area, for example, in a hydrolysis process that forms a hydroxyl-rich area on the activated area of the substrate.

Figure 4:
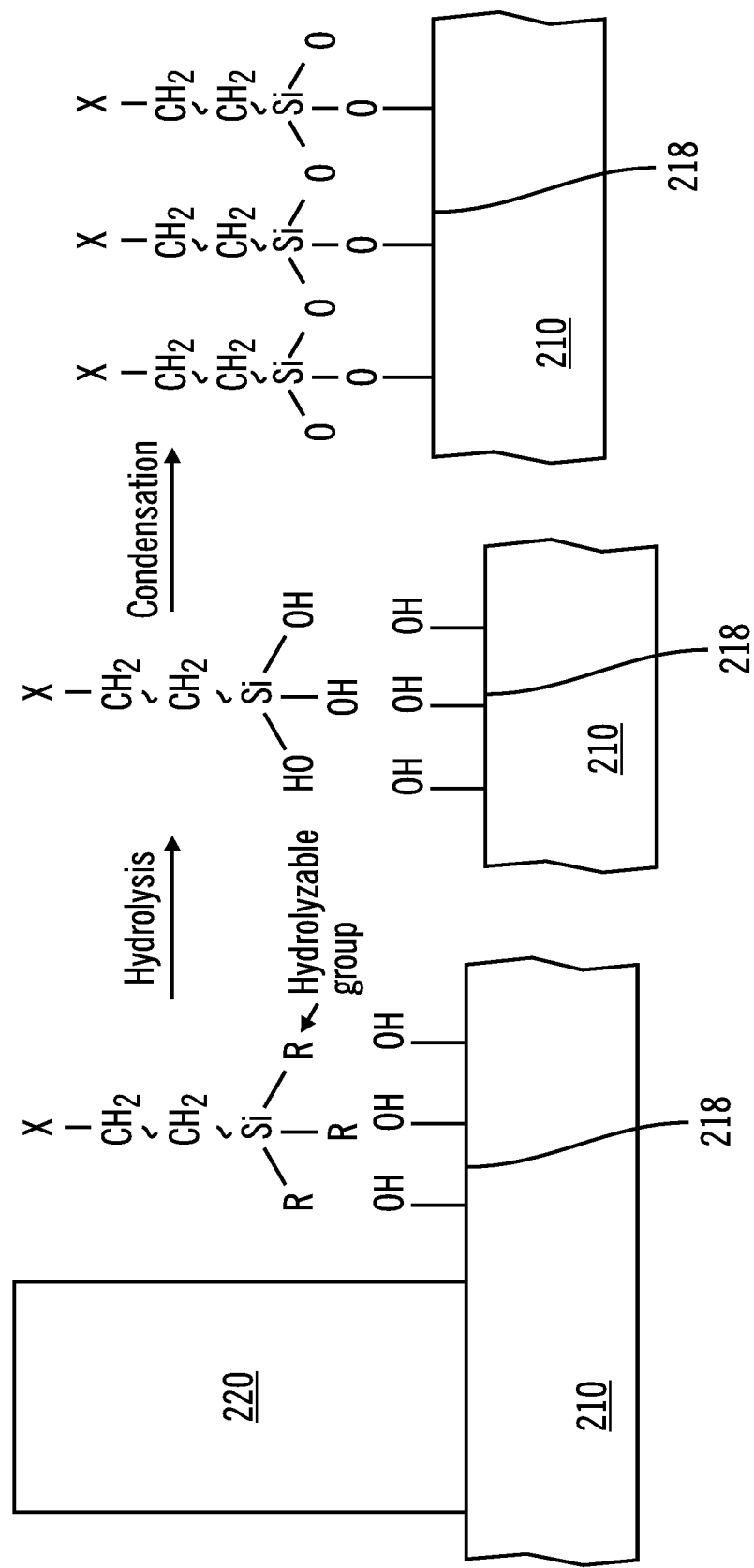
FIG. 4 illustrates certain operations in the formation of a self-assembled monolayer on a substrate, in accordance with certain embodiments.

Box 109 of FIG. 3 is forming a self-assembled monolayer (SAM) on the modified activated area. Certain embodiments are formed from an organosilicon compound such as a siloxane (for ex., $R_3Si$—O—$SiR_3$) or silanol (for ex., $R_3SiOH$). FIG. 4 illustrates an example of SAM formation on a portion of a substrate 210 having a modified activated area 218 (laser activated and hydrolyzed), positioned adjacent to a preformed feature 220 such as, for example, a bonding pad to be electrically coupled to a metal structure formed on the activated region. FIG. 4 illustrates the formation of a self-assembled monolayer (SAM) on a substrate, with the left side of the figure showing a portion of the substrate including a preformed feature 220 adjacent to an activated region, the center portion of the figure showing the hydrolysis of the activated region, and the right side of the figure showing the condensation reaction that couples the SAM to the substrate. The performed feature 220 is only illustrated in the left side of FIG. 4, for clarity. In one embodiment, an organosilicon (siloxane) compound is dissolved in a solvent such as toluene, dimethylformanide (DMF), or hexane and is introduced to the modified activated area 218 on the substrate 210, as seen in the left side of FIG. 4. The siloxane undergoes hydrolysis to form a plurality of OH (hydroxyl) groups, as seen in the central portion of FIG. 4, followed by a condensation with hydroxyl moieties on the modified activated area 218 of the substrate 210 to form the monolayer, as seen in the right side of FIG. 4. The organosilicon compound may include a functional group, X, that is suitable for reaction with a catalyst. Representative functional groups may include, but are not limited to, an amine moiety, a sulfhydryl moiety and a pyridil moiety, for reacting with, for example, a palladium (Pd) catalyst.

Figure 5:
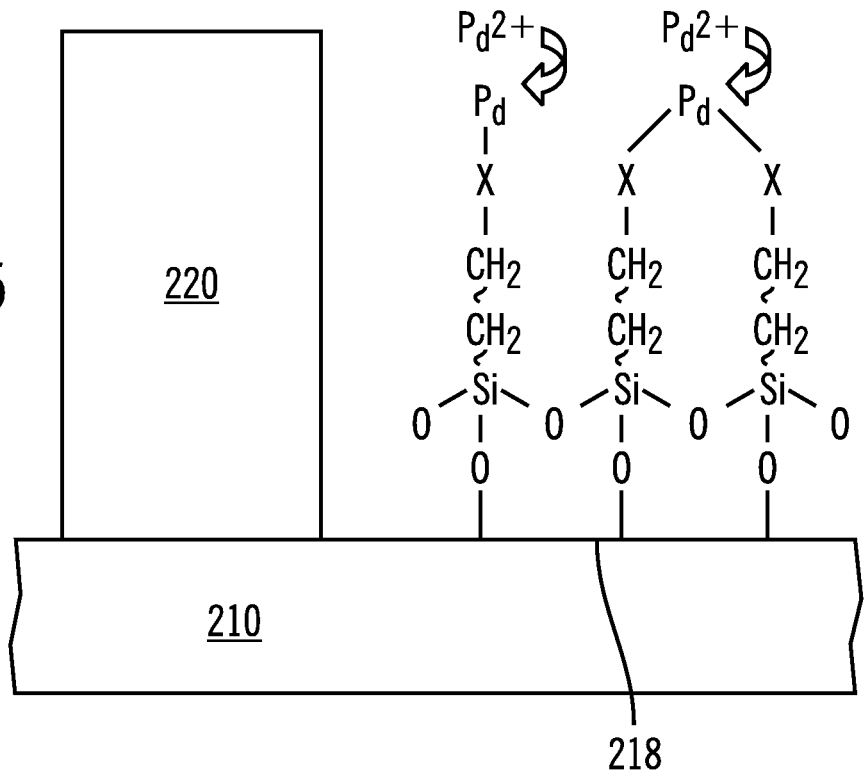
FIG. 5 illustrates a catalyst being coupled to the self-assembled monolayer of FIG. 4, in accordance with certain embodiments.

Box 111 of FIG. 3 is absorbing a catalyst on the SAM layer. This may be carried out by reacting the SAM layer with a catalyst such as a palladium (Pd) material. As noted above, when the SAM includes a suitable reactive functional group (for ex., an amine moiety, a sulfhydryl moiety, a pyridil moiety), the SAM may react with a catalyst. A reaction of palladium ions with the functional groups X of a self-assembled monolayer attached to the substrate 210 at area 218, in accordance with certain embodiments, is illustrated in FIG. 5. The palladium is in an oxidized state ($Pd^{2+}$) in solution (e.g., $PdCl_2$). The palladium ions may attach to the functional groups X of the self-assembled monolayer. As a result, the palladium catalyst reaction (e.g., absorption) will be carried out on the activated area 218 of the substrate 210.

Figure 6:
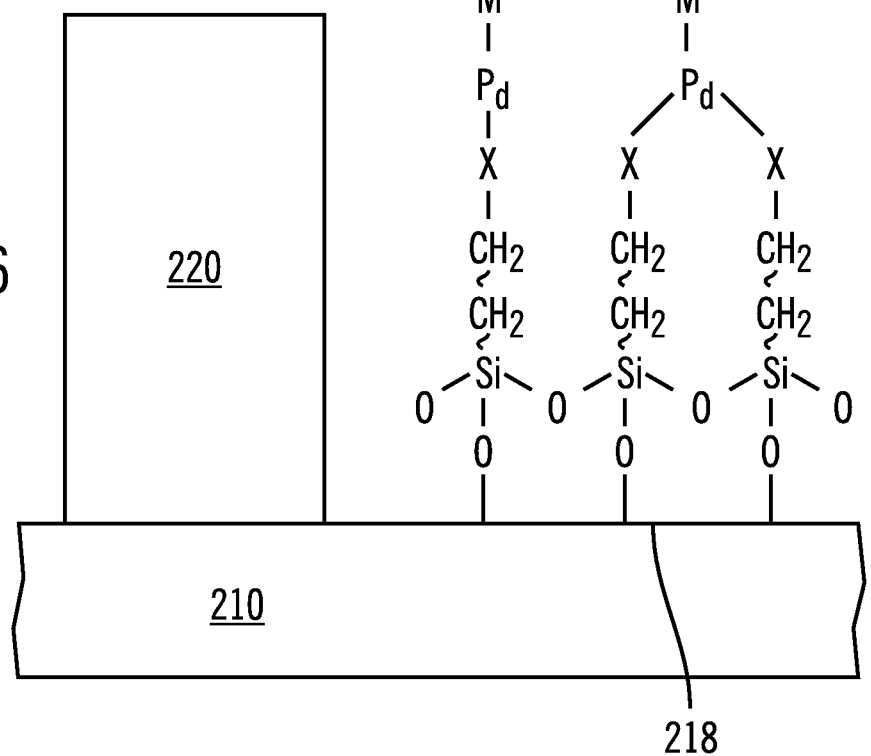
FIG. 6 illustrates a metal being coupled to the self-assembled monolayer of FIG. 5, in accordance with certain embodiments.

Box 113 of FIG. 3 is depositing metal on the catalyst activated area to form the desired metallized features, including, but not limited to, traces and pads. A reaction of a metal material with the palladium catalyst on the SAM, in accordance with certain embodiments, is illustrated in FIG. 6, with the palladium (Pd) positioned between the metal) ($M^0$) and the functional group (X) of the SAM. The substrate 210 or a portion thereof may be placed in a bath with an ionic form of the metal (for ex., nickel ion, copper ion, etc.) and a reducing agent such as, for example, an amine, a borane or a hypophosphite. An electroless oxidation-reduction (redox) reaction occurs between the reducing agent in the bath and an electrolyte. The reducing agent is oxidized and palladium on the SAM is reduced. The reduced palladium acts as a catalyst for a reduction of the metal ions in the bath to metallic to form first nuclei and then form a metal film, resulting in metallization that forms structures such as, for example, traces or pads, of a predetermined shape and size.

The above operations permit the formation of electrically conductive (metallized) structures that may be formed in electrical contact with other features, by electroless deposition through the use of self-assembled monolayers (SAMs) grafted on activated substrates. The activated area may be defined by the area of laser treatment on the substrate. The SAMs are able to bind catalyst ions that act as nucleation points for a metal electroless reaction and metal deposition. Exposing the nucleation points on the SAMs to an electroless bath allows desired metal ions to be reduced to form the desired metal structure. A thickness of the metal may be controlled based on the exposure to the bath. Metallization of structures of virtually any size or shape may be formed.

Figure 7A:
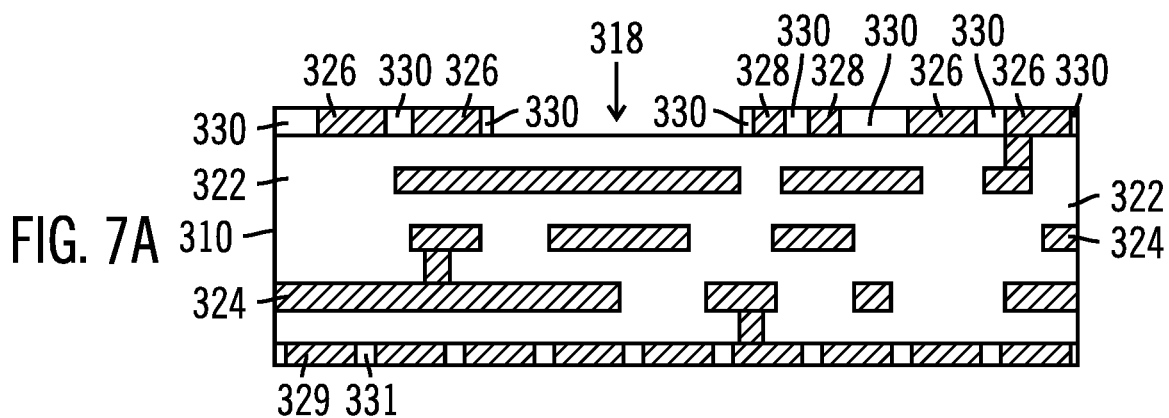
FIGS. 7A-7F illustrate operations for forming a device including a late binding region, in accordance with certain embodiments.

FIGS. 7A-7F illustrate the formation of a device in accordance with certain embodiments comprising a multilayer substrate including a plurality of preformed features and a region where additional structures are formed using a SAM method including electroless metal deposition such as described above. The multilayer substrate may in certain embodiments be a microelectronic package substrate or a printed circuit board (PCB). FIG. 7A illustrates a multilayer substrate 310 having regions of dielectric material 322 and electrically conductive pathways 324 therein. The substrate 310 includes an upper layer of electrically conductive regions 326, 328 that may comprise, for example, pads or traces, and dielectric material 330. The electrically conductive regions may vary in size, depending on, for example, the use of the region. In FIG. 7A the regions 326 are wider than the regions 328. The regions 326, 328 may be formed from, for example, a metal, and the dielectric material 330 may be formed from, for example, a solder resist material. The regions 326, 328 may be formed using any suitable method, including, for example, deposition, masking, and etching processes. The exposed area 318 is where late binding to form additional structures such as, for example, additional traces and pads, may be carried out. The substrate 310 may also include lower pads 329 separated by a layer 331 such as a solder resist layer.

Figure 7B:
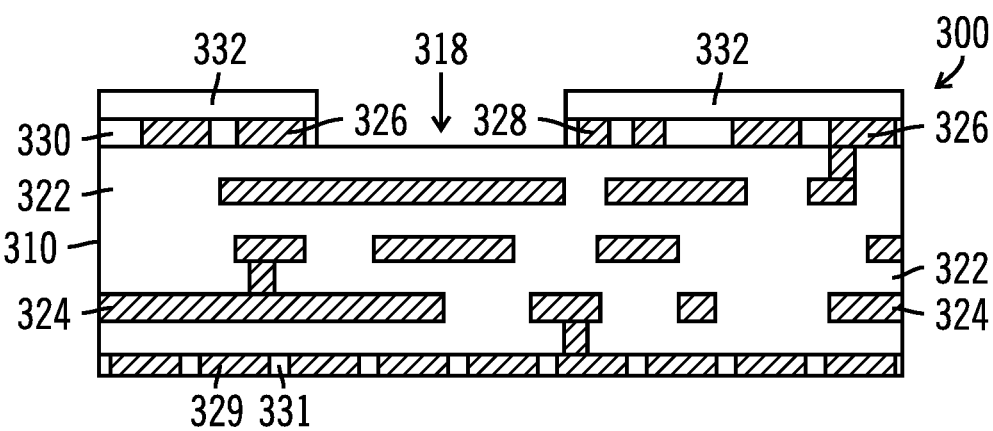

FIG. 7B illustrates the formation of an optional protective layer 332 on the traces 326, the pads 328, and the dielectric material 330. The protective layer 332, if used, is selected to protect at least some of the structures and surfaces in the vicinity of the exposed region 318 during the late binding processing operations. The protective layer 332 may be formed from any suitable material, for example, a wax or other polymer based material. The protective layer 332 or portions thereof may be removed in a subsequent operation.

Figure 7C:
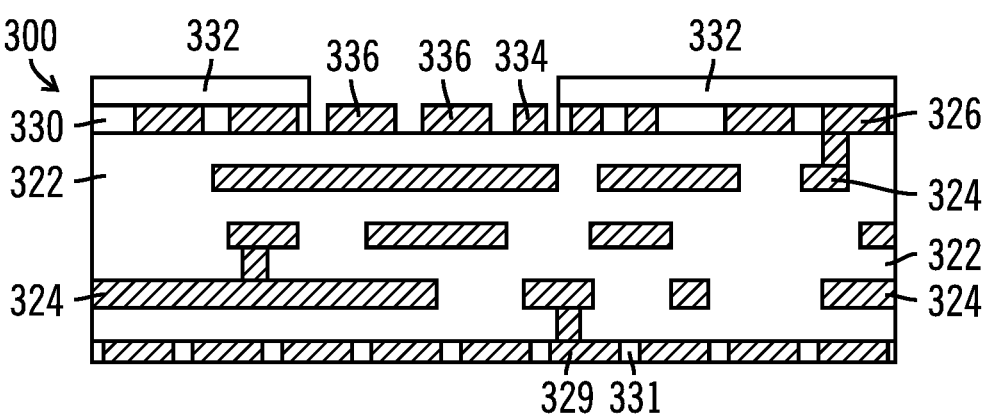
Figure 7D:
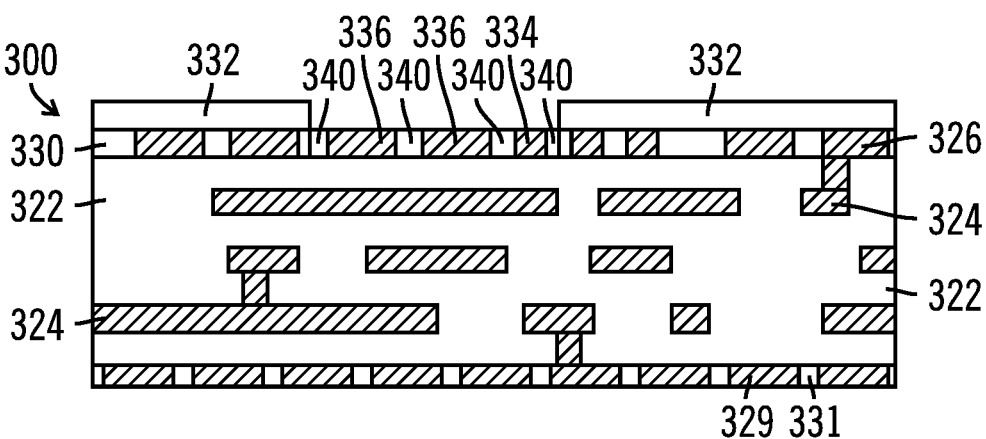

FIG. 7C illustrates the formation of a plurality of metallized structures 334, 336 in the open region 318 in a late binding process. In the illustrated embodiment, the structures 336 are wider than the structure 334, because the structures 336 may be configured to be coupled to a different component than the structure 334 and a different geometry is used. The structures 334, 336 may be formed using a SAM assisted deposition process such as described above. The structures 334, 336 may be metal structures including, but not limited to, traces, pads, and interconnects. FIG. 7D illustrates the formation of a solder resist layer 340 so that the exposed region is covered. While the solder resist layer 340 is illustrated in FIG. 7D as having the same height as the structures 334, 336, and the earlier formed solder resist 330 and electrically conductive regions 326, 328, the solder resist layer 340 could alternatively have a greater or smaller height. The sizes of all of the elements (the preformed electrically conductive regions 326, 328, the preformed solder resist 330, the late formed structures 334, 336, and the late formed solder resist layer 340) may all vary relative to one another if desired.

Figure 7E:
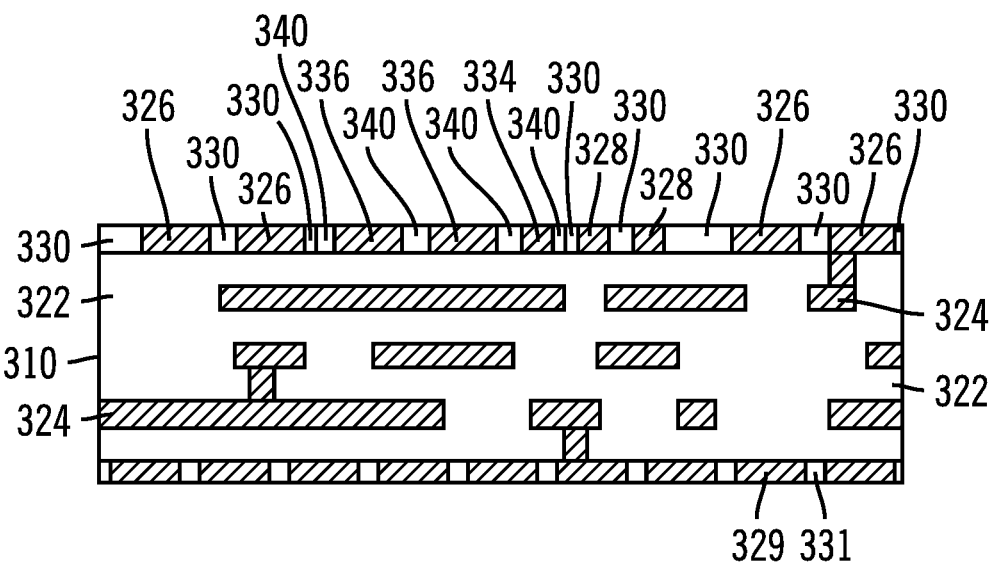
Figure 7F:
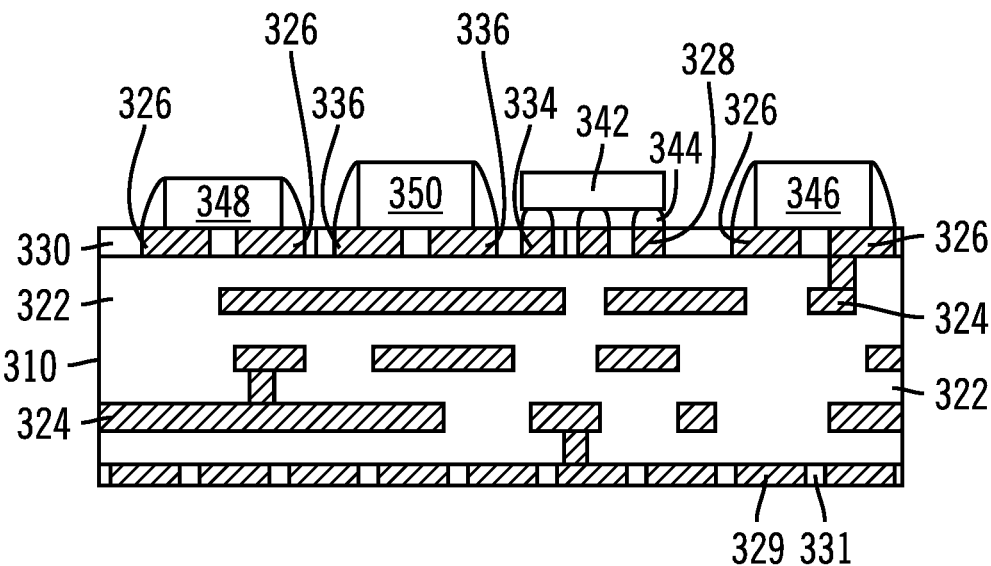

FIG. 7E illustrates the removal of the protective layer 332 after the structures 334, 336 have been formed. Removal of the protective layer 332 enables the electrical coupling of various components (including, but not limited to, die structures, memory, transceivers, capacitors, resistors, and oscillators), to the structure 334, 336, and the previously formed electrically conductive regions 326, 328 if desired. For example, as illustrated in FIG. 7F, the two structures 336 are coupled to a component 350, the one structure 334 and two of the previously formed electrically conductive regions 328 are coupled to a component 342 through solder bumps 344, a first two of the previously formed electrically conductive regions 326 are coupled to a component 348, and a second two of the previously formed electrically conductive regions 326 are coupled to a component 346. In an alternative embodiment, at least some components may be coupled to electrically conductive regions in the uppermost layer immediately after their formation (and prior to any late forming of structures), so that a minimum number of operations are performed after the late forming process is carried out. It should be noted that in certain embodiments, the structures 334, 336 that are late formed using SAM assisted electroless plating may include palladium (Pd) coupled to the functional group on the SAM between the electrolessly plated metal and the underlying substrate. The features 326, 328, on the other hand, may in certain embodiments be formed using a process and materials that do not include Pd in or between the feature 326, 328 and the underlying substrate.

Figure 8A:
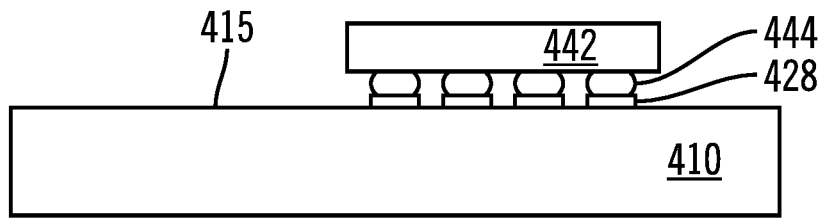
FIGS. 8A-8E illustrate operations for forming a device including a late binding region, in accordance with certain embodiments.
Figure 8B:
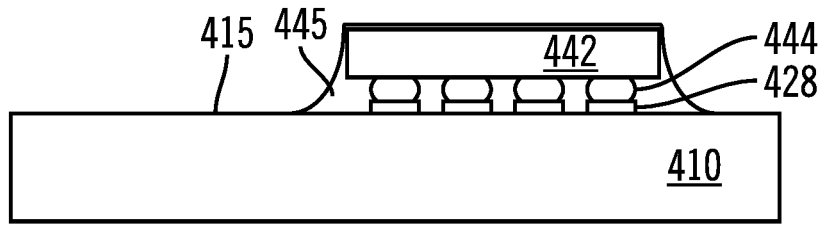
Figure 8C:
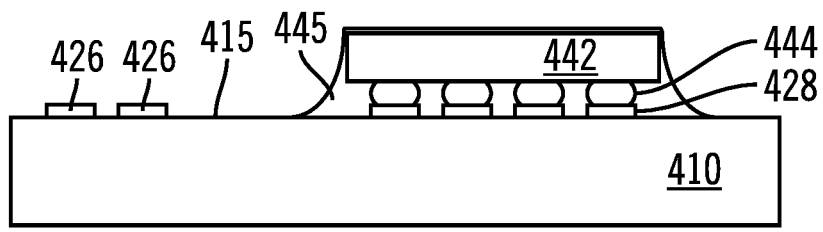
Figure 8D:
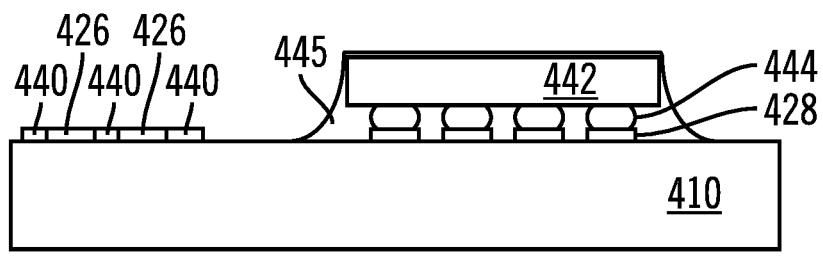
Figure 8E:
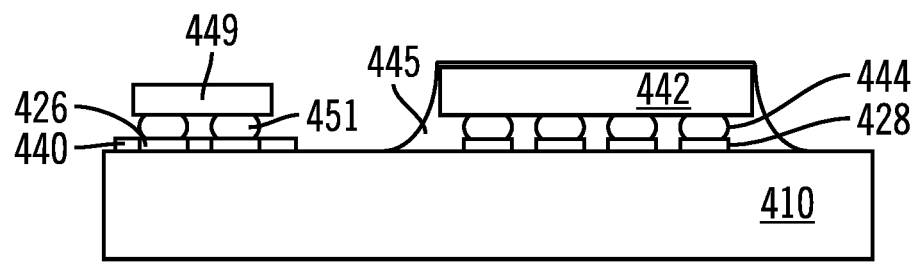

FIGS. 8A-8E illustrate the formation of a device in accordance with certain embodiments comprising a substrate including a preformed feature and a region where additional structures are formed using a SAM method including electroless metal deposition such as described above. The substrate may in certain embodiments be a package substrate, a printed circuit board (PCB), a wafer, or a die structure. The preformed feature may be one or more features comprising components attached to a substrate to create a final product, except for the late binding region on which structures including, but not limited to, pads and traces, will be formed so that the product can include a sensor or other final component for which the final configuration was not decided until late in the design process. FIG. 8A illustrates a substrate 410 including a feature such as a die 442 coupled thereto through solder bumps 444 coupled to pads 428 on the surface 415 of the substrate 410. FIG. 8B illustrates the formation of a protective layer 445 covering the die 442. The protective layer 445 may in certain embodiments comprise a wax or other suitable polymeric material. FIG. 8C illustrates the late forming of pads 426 on the surface 415 on the left side of the figure. The late forming process may be a SAM assisted deposition process such as the SAM assisted electroless deposition process described above. FIG. 8D illustrates forming a protective layer such as a solder resist layer 440 adjacent to the new formed pads 426. FIG. 8E illustrates coupling a component 449 to the pads 426 through solder bumps 451.

Figure 9A:
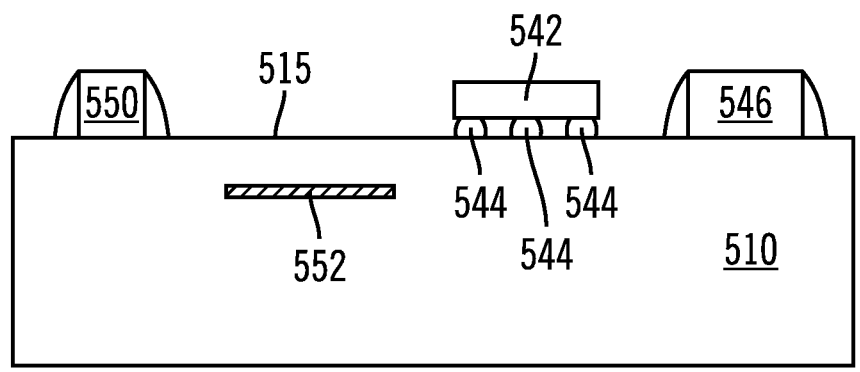
FIGS. 9A-9B illustrate operations for forming an antenna device, in accordance with certain embodiments.
Figure 9B:
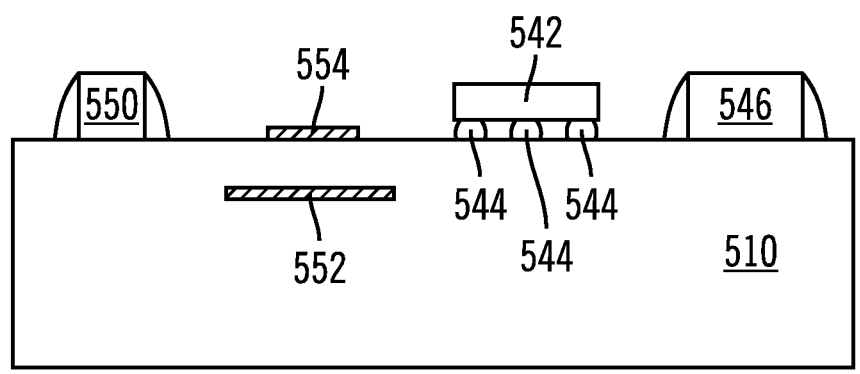

Certain embodiments relate to the formation of a variety of antenna structures. For example, FIG. 9A illustrates a substrate 510 including a microstrip patch antenna having a first resonant patch segment 552 that is formed during the earlier substrate 510 processing in an interior region (between the surface 515 and the surface 517) and which provides a first resonance around a frequency of interest. The substrate 510 may include a plurality of layers, including a ground plane layer and other electrically conductive pathways and dielectric layers, and may include, for example, components 542, 546, and 550 positioned on a surface thereof, with component 542 coupled to the surface through solder bumps 544. Using a process such as a SAM method including electroless metal deposition as described above, a second, precise parasitic patch segment 554 may be formed above the first patch segment 552, as illustrated in FIG. 9B, to enable a second resonance and therefore extend the bandwidth of the antenna. For example, in one embodiment, the antenna segment 552 may have a bandwidth of 25 GHz. The bandwidth may be increased from 25 GHz to 26 GHz through the formation of the second, parasitic patch segment 554. While FIG. 9B illustrates the use of one late formed patch segment 554, embodiments may include more than one late formed patch if desired. In certain embodiments, the late binding of additional parasitic patches may be optimized based on the fabrication tolerance of the incoming board or package substrate.

FIGS. 10A-10D illustrate another embodiment including an antenna that is initially suitable for a given frequency but which includes additional spaced apart segments that can be connected if desired to modify the frequency. Such a structure may be suitable for country specific products where allocation of the frequency spectrum is unique. In such a situation, the same base product may be used in different countries, but a different antenna frequency is needed. One or more of the additional segments may be connected during a late binding process such as a SAM method including selective electroless metal deposition as described above, in order to modify the frequency as needed in each country.

Figure 10A:
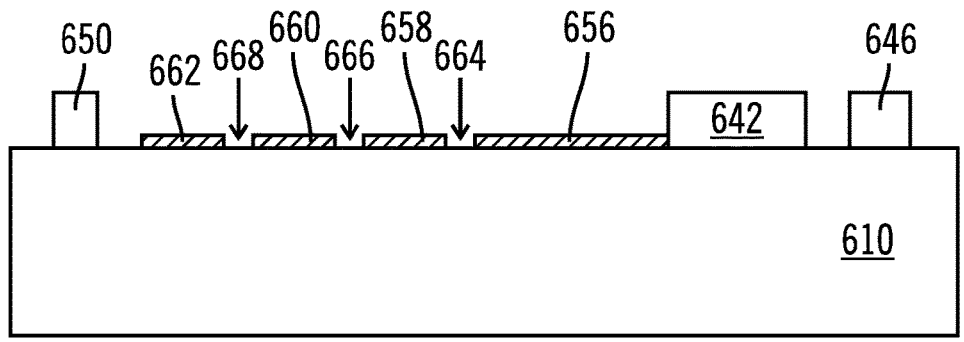
FIGS. 10A-10D illustrate operations for forming an antenna device, in accordance with certain embodiments.

As illustrated in FIG. 10A, a substrate 610 may include a plurality of components 642, 646, 650. The substrate also include an antenna component including main antenna structure segment 656 and spaced apart antenna segments 658, 660, and 662 that are not electrically coupled to the main antenna structure during the initial formation of the substrate and the coupling of the components 642, 646, and 650 thereto. The main antenna segment 656 may be configured to provide a suitable frequency that is suitable for a particular geographical location or for a particular carrier. Once a determination is made regarding the desired frequencies for other locations, a late binding process such as a SAM method including electroless metal deposition as described above, may be used to form one or more connecting sections that electrically couple one or more of the floating antenna segments 658, 660, and 662 to the main antenna structure 656.

Figure 10B:
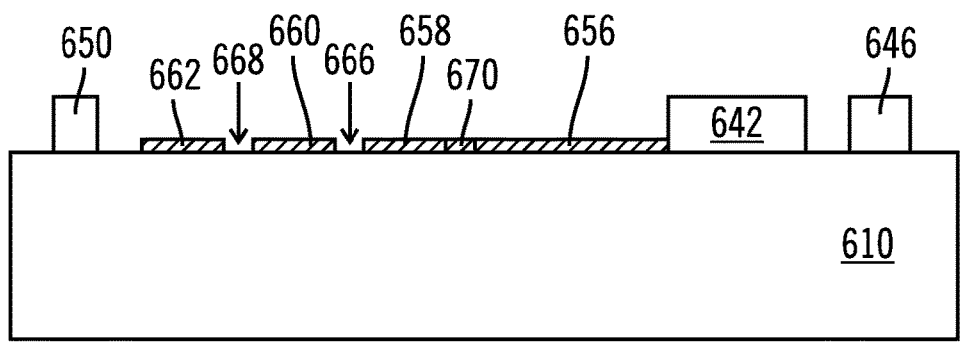
Figure 10C:
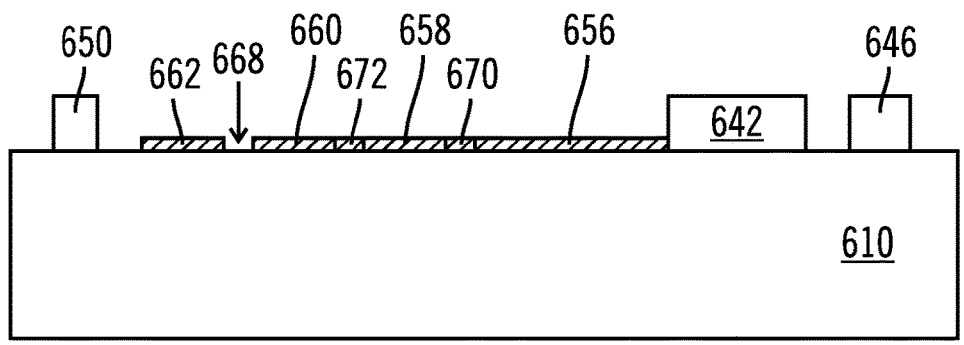
Figure 10D:
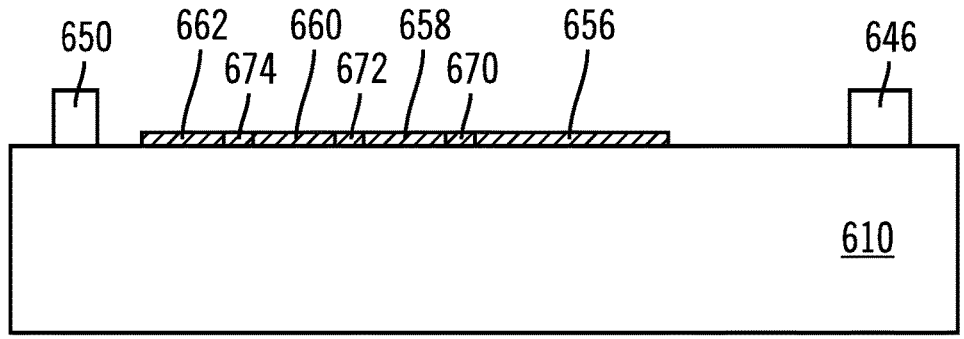

FIGS. 10B, 10C, and 10D illustrate embodiments where one, two or three of the spaced apart antenna segments 658, 660, 662 are electrically coupled to the main antenna segment 656 by late binding metal structures comprising connecting sections in one or more of the regions 664, 666, and 668 on the surface of the substrate 610. FIG. 10B illustrates the late binding of a metal structure including a first connecting section 670 in the region 664 to electrically couple the antenna segment 658 to the main antenna segment 656. Lengthening the antenna may act to provide lower frequency operation.

FIG. 10C illustrates late binding of metal structure including a second connecting section 672 in the region 666 between the antenna segment 660 and the antenna segment 658, to electrically couple the antenna segment 660 to the antenna segment 658, which is electrically coupled to the main antennal structure 656 through first connecting section 670 of the late formed metal structure. FIG. 10D illustrates late binding of a metal structure including a third connecting section 674 in the region 668 to electrically couple the antenna segment 662 to the antenna segment 660, which is electrically coupled to the antenna segment 658 through second connecting section 672, with the antenna segment 658 electrically coupled to the main antennal structure 656 through first connecting section 670. The connecting sections 670, 672, and 674 of the metal structure may be formed together during the same late binding process or may be formed during different late binding processes. Various embodiments may include any desired number of floating, spaced apart antenna segments that can be at least partially coupled together to modify the frequency and bandwidth of the antenna. Certain alternative embodiments may start with a preformed long antenna structure (that operates at low frequency) that is later processed using a process such as a metal removal process such as etching or laser melting to reduce the length of the antenna so it can work at higher frequencies.

Embodiments may also include the formation of multilayer structures using a SAM assisted construction method such as described above. This may be carried out by depositing another dielectric layer over the metal layer formed, then the layer as described above to form another metal layer thereon, for forming a structure including, but not limited to, a multilayer component including a capacitor such as a MIM (metal insulator metal), and a filter (or filter component) or other structure requiring a ground plane. Multilayer structures may include some layer(s) on which a SAM is formed and other layer(s) on which no SAM is formed.

Figure 11A:
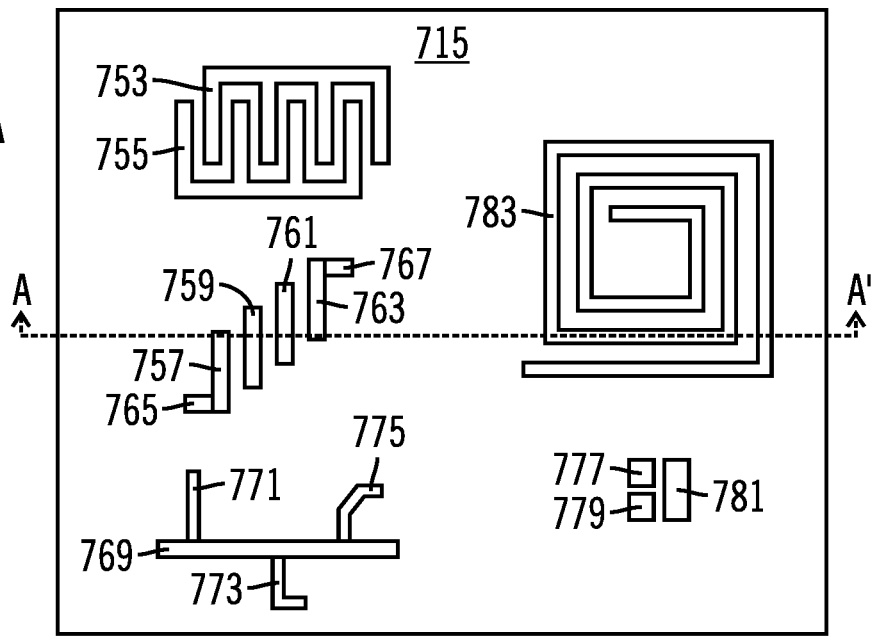
FIGS. 11A-11B illustrate a substrate including a plurality of structures formed thereon, in accordance with certain embodiments.

FIG. 11A illustrates a top down view of a surface 715 of a dielectric layer on a substrate, including a plurality of structures that may be at least partly formed using the SAM formation and metal deposition operations described above. Each of the structures illustrated may be coupled to other structures (not shown) on the surface 715 or at another layer of the device. The illustrated structures include: (i) a capacitor having electrodes 753 and 755; (ii) a distributed filter including traces 757, 759, 761, and 763, with signal-in section 765 coupled to trace 757 and signal-out section 767 coupled to trace 763; (iii) a signal trace 769 including stubs 771, 773, and 775 extending therefrom; (iv) pads 777, 779, 781 for coupling another component (including, but not limited to, a die, memory, sensor, antenna, high speed transceiver, and other RF (radio frequency) and non-RF elements) thereto; and (v) an inductor 783. The number, size, and layout of pads 777, 779, and 781 may vary depending on factors such as the footprint of the component to be coupled to the pads. A protective layer dielectric layer or solder mask may be positioned on the structures if desired.

Figure 11B:
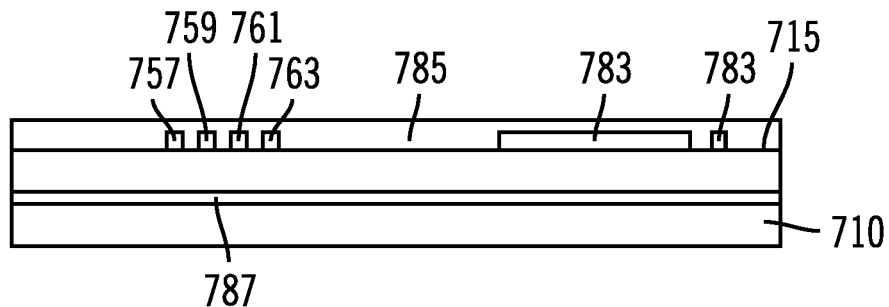

FIG. 11B illustrates a cross-sectional view along the line A-A' in FIG. 11A, and includes the filter including traces 757, 759, 761, 763, as well as the inductor 783, positioned on the surface 715 on the substrate 710. A protective layer 785 is illustrated on the traces 757, 759, 761, 763 and on the inductor 783. The substrate 710 may include an embedded ground plane 787.

Figure 12:
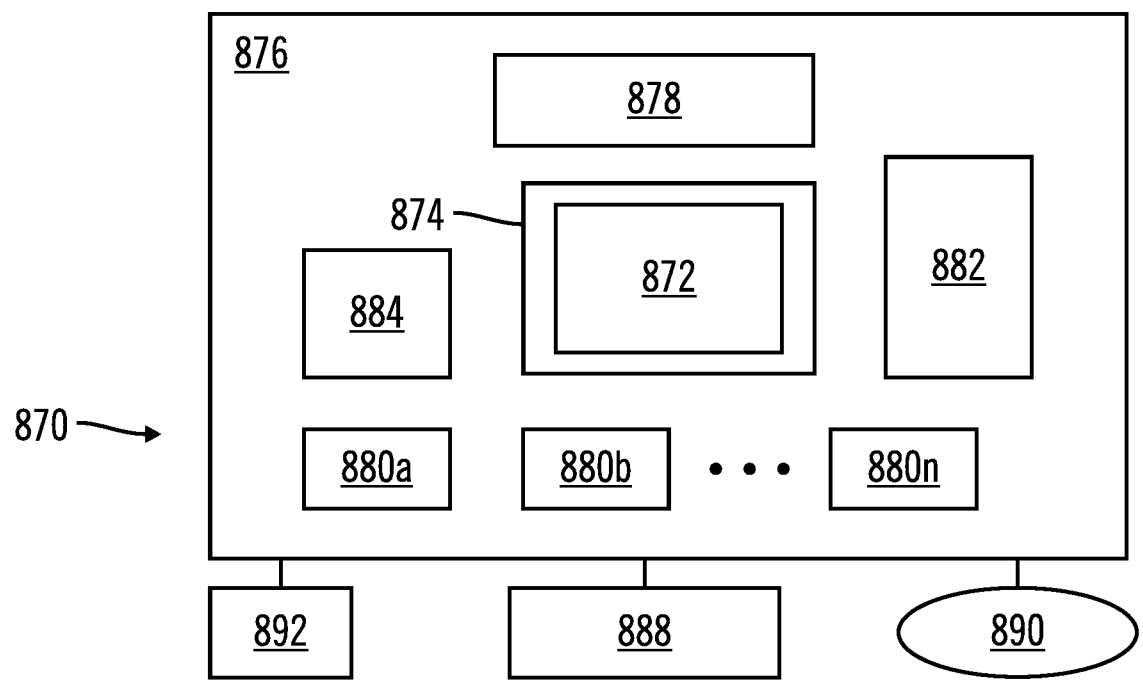
FIG. 12 illustrates an electronic system arrangement in which embodiments may find application.

Assemblies including components formed as described in embodiments above may find application in a variety of electronic components. FIG. 12 schematically illustrates one example of an electronic system environment in which aspects of described embodiments may be embodied. Other embodiments need not include all of the features specified in FIG. 12, and may include alternative features not specified in FIG. 12. The system 870 of FIG. 12 may include at least one die such as a CPU 872 positioned in a package substrate 874, which is then coupled to a substrate such as a printed circuit board (PCB) 876 (for example, a motherboard). The system 870 includes a memory region 878 that may include any suitable memory, for example, DRAM. One or more controllers 880a, 880b . . . 880n, may also be disposed on the PCB 876. The system may also include components 882, 884, which may be any suitable component including, but not limited to, sensors, transceivers, and antennas. The system 870 may be formed with additional components, including, but not limited to, storage 888, display 890, and network connection 892. Any of the structures on the PCB 876 may be formed in a late forming process, after most or all of the other features have been formed, using a process such as the self-assembled monolayer (SAM) structuring process described above. For example, the bonding pads and traces used to support and connect any component to the PCB 876 may be formed using a late binding process such as described above.

The system 870 may comprise any suitable computing device, including, but not limited to, a mainframe, server, personal computer, workstation, laptop, tablet, netbook, handheld computer, handheld gaming device, handheld entertainment device (for example, MP3 (moving picture experts group layer-3 audio) player), PDA (personal digital assistant) smart phone or other telephony device (wireless or wired), network appliance, virtualization device, storage controller, network controller, router, etc.

Various features of embodiments described above may be implemented with respect to other embodiments, including apparatus and method embodiments. The order of certain operations as set forth in embodiments may also be modified. Specifics in the examples may be used anywhere in one or more embodiments.

In the present description, various features are grouped together for the purpose of streamlining the disclosure. This method of disclosure is not to be interpreted as reflecting an intention that the claimed embodiments of the invention require more features than are expressly recited in each claim. Rather, as the claims reflect, inventive subject matter may lie in less than all features of a single disclosed embodiment. Thus the claims are hereby incorporated into the Detailed Description, with each claim standing on its own as a separate embodiment.

While certain exemplary embodiments are described herein and shown in the accompanying drawings, it is to be understood that such embodiments are merely illustrative and not restrictive, and that embodiments are not restricted to the specific constructions and arrangements shown and described since modifications may occur to those having ordinary skill in the art. The terms "a" and "an" mean "one or more", unless expressly specified otherwise. Terms such as "first", "second", and the like may be used herein and do not necessarily denote any particular order, quantity, or importance, but are used to distinguish one element from another. Terms such as "upper", "lower", "top", "bottom", and the like may be used for descriptive purposes only and are not to be construed as limiting. Embodiments may be manufactured, used, and contained in a variety of positions and orientations.

EXAMPLES

The following examples pertain to further embodiments. Specifics in the examples may be used anywhere in one or more embodiments.

Example 1 is a method for processing a substrate comprising: providing a substrate including a first portion and a second portion, the first portion including a feature, the feature including an electrically conductive region, the second portion including a dielectric surface region; performing self-assembled monolayer (SAM) assisted structuring to form a structure comprising a metal on the dielectric surface region; the feature being formed using a process other than the SAM assisted structuring used to form the structure; and the structure being formed after the feature.

In Example 2, the subject matter of any one of Examples 1 and 3-11 can optionally include coating at least a portion of the feature on the substrate with a protective layer prior to the performing the self-assembled monolayer assisted structuring.

In Example 3, the subject matter of any one of Examples 1-2 and 4-11 can optionally include wherein the structure comprising a metal comprises at least one structure selected from the group consisting of traces and pads.

In Example 4, the subject matter of any one of Examples 1-3 and 5-11 can optionally include wherein the feature comprises at least one component selected from the group consisting of traces, pads, active devices, and passive devices.

In Example 5, the subject matter of any one of Examples 1-4 and 6-11 can optionally include wherein the feature comprises an antenna, wherein the antenna comprises a patch antenna segment positioned in an interior portion of the substrate, and wherein the structure comprises a parasitic patch segment spaced a distance away from the patch antenna segment.

In Example 6, the subject matter of any one of Examples 1-5 and 7-11 can optionally include wherein the feature comprises a first antenna segment and a second antenna segment spaced apart from the first antenna segment, and forming the structure to include a connecting section positioned between the first antenna segment and the second antenna segment.

In Example 7, the subject matter of any one of Examples 1-6 and 8-11 can optionally include wherein the feature further comprises a third antenna segment spaced apart from the second antenna segment, and a fourth antenna segment spaced apart from the third antenna segment.

In Example 8, the subject matter of any one of Examples 1-7 and 9-11 can optionally include wherein the connecting section is a first connecting section, and forming the structure to further include a second connecting section positioned between the second antenna segment and the third antenna segment.

In Example 9, the subject matter of any one of Examples 1-8 and 10-11 can optionally include forming the structure to further include a third connecting section positioned between the third antenna segment and the fourth antenna segment.

In Example 10, the subject matter of any one of Examples 1-9 and 11 can optionally include wherein the performing the self-assembled monolayer (SAM) assisted structuring comprises: activating a portion of the dielectric surface region using laser patterning; modifying the activated portion by performing hydrolysis to form hydroxyl-rich areas; coupling a self-assembled monolayer to the hydroxyl-rich area; coupling a catalyst to the self-assembled monolayer; and coupling a metal to the self-assembled monolayer including the catalyst coupled thereto.

In Example 11, the subject matter of any one of Examples 1-10 can optionally include wherein the coupling the metal to the self-assembled monolayer including the catalyst coupled thereto comprises performing electroless deposition.

Example 12 is a method for processing a substrate, comprising: providing a substrate including a first region and a second region, the first region comprising a die field including a plurality of pads; performing self-assembled monolayer (SAM) assisted structuring to form a structure comprising a metal on the second region; and the pads in the die field being formed using a process other than the SAM assisted electroless structuring used to form the structure comprising a metal on the second region.

In Example 13, the subject matter of any one of Examples 12 and 14-17 can optionally include configuring the structure comprising a metal to be electrically coupled to at least one pad in the die field.

In Example 14, the subject matter of any one of Examples 12-13 and 15-17 can optionally include forming the structure to include a plurality of components selected from traces and pads.

In Example 15, the subject matter of any one of Examples 12-14 and 16-17 can optionally include forming the structure to include a plurality of pads, and positioning a sensor on at least some of the plurality of pads.

In Example 16, the subject matter of any one of Examples 12-15 and 17 can optionally include forming the structure to include at least one passive component selected from the group consisting of a trace, a pad, a trace, a stub, an inductor, a capacitor, and an RF element.

In Example 17, the subject matter of any one of Examples 12-16 can optionally include forming the structure to include at least a portion of an antenna.

Example 18 is an electronic device comprising: a feature positioned on a first portion of a substrate, the feature including an electrically conductive region; a structure positioned on a second portion of the substrate, the structure comprising a metal positioned on a self-assembled monolayer (SAM) on the substrate, wherein the SAM is positioned between the metal and the substrate; the structure electrically coupled to the feature; and wherein the feature is positioned on the substrate in the absence of a SAM therebetween.

In Example 19, the subject matter of any one of Examples 18 and 20-28 can optionally include wherein the feature comprises as least one feature selected from the group consisting of a trace, a pad, an active device, and a passive device.

In Example 20, the subject matter of any one of Examples 18-19 and 21-28 can optionally include wherein the structure comprising a metal includes a first metal and a second metal, the second metal comprising palladium (Pd), wherein the palladium is positioned between the first metal and the substrate, and wherein the device includes an absence of palladium between the feature and the substrate.

In Example 21, the subject matter of any one of Examples 18-20 and 22-28 can optionally include wherein the structure comprises at least one passive component selected from the group consisting of a trace, a pad, a trace, a stub, an inductor, a capacitor, and an RF element.

In Example 22, the subject matter of any one of Examples 18-21 and 23-28 can optionally include wherein the structure comprises a plurality of pads configured to serve as a footprint for a component selected from the group consisting of a memory component and a transceiver component.

In Example 23, the subject matter of any one of Examples 18-22 and 24-28 can optionally include wherein the feature comprises an antenna.

In Example 24, the subject matter of any one of Examples 18-23 and 25-28 can optionally include wherein the substrate includes a first surface, a second surface, and an interior region between the first surface and the second surface, wherein the antenna comprises an antenna segment positioned in the interior region, and wherein the structure comprises an additional antenna segment positioned on the first surface.

In Example 25, the subject matter of any one of Examples 18-24 and 26-28 can optionally include wherein the antenna comprises a first antenna segment and a second antenna segment, and wherein the structure is positioned between the first antenna segment and the second antenna segment and electrically couples the first antenna segment to the second antenna segment.

In Example 26, the subject matter of any one of Examples 18-25 and 27-28 can optionally include: the antenna comprising first, second, third and fourth antenna segments; the second antenna segment spaced apart from the first antenna segment on the substrate; the third antenna segment spaced apart from the second antenna segment on the substrate, wherein the second antenna segment is positioned between the first antenna segment and the third antenna segment; the fourth antenna segment spaced apart from the third antenna segment on the substrate; wherein the third antenna segment is positioned between the second antenna segment and the fourth antenna segment; and the structure including a section positioned between the first antenna segment and the second antenna segment that electrically couples the first antenna segment to the second antenna segment.

In Example 27, the subject matter of any one of Examples 18-26 and 28 can optionally include wherein the section is a first section, and wherein the structure further includes a second section positioned between the second antenna segment and the third antenna segment that electrically couples the second antenna segment to the third antenna segment.

In Example 28, the subject matter of any one of Examples 18-27 can optionally include wherein the structure further includes a third section positioned between the third antenna segment and the fourth antenna segment that electrically couples the third antenna segment to the fourth antenna segment.

Example 29 is an electronic device comprising: a substrate including a first portion and a second portion, the first portion including a feature, the feature including an electrically conductive region, the second portion including a dielectric surface region; means for performing self-assembled monolayer (SAM) assisted structuring to form a structure comprising a metal on the dielectric surface region; and means for forming the feature prior to forming the structure, using a process other than the SAM assisted structuring used to form the structure.

Example 30 is an apparatus comprising means to perform a method as claimed in any preceding claim.

What is claimed:

1. A device comprising:
   a substrate;
   a first capacitor electrode and a second capacitor electrode positioned on the substrate, the first capacitor electrode and the second capacitor electrode each including a plurality of fingers, wherein at least some of the fingers of the first capacitor electrode are interleaved with at least some of the fingers of the second capacitor electrode, the first capacitor electrode and the second capacitor electrode each comprising a metal positioned on a self-assembled monolayer (SAM) on the substrate, wherein the SAM is positioned between the metal and the substrate
   a dielectric layer positioned between the first capacitor electrode and the second capacitor electrode;
   a first feature electrically coupled to the first capacitor electrode;
   a second feature electrically coupled to the second capacitor electrode;
   wherein the first feature is positioned on the substrate in the absence of a SAM between the first feature and the substrate; and
   wherein the second feature is positioned on the substrate in the absence of a SAM between the second feature and the substrate.

2. The device of claim 1, wherein the first capacitor electrode and the second capacitor electrode are positioned on a common surface of the substrate.

3. The device of claim 2, further comprising a dielectric layer positioned between the dielectric layer and the SAM along a length of the first capacitor electrode, and wherein the second capacitor electrode is positioned between the dielectric layer and the SAM along a length of the second capacitor electrode.

4. The device of claim 1, further comprising a ground plane layer embedded in the substrate.

5. The device of claim 1, wherein the first and second capacitor electrodes are positioned at a common height in the substrate.

6. The device of claim 1, wherein the SAM comprises an organosilicon compound.

7. A device comprising:
a substrate;
a filter positioned on the substrate, the filter including a plurality of spaced apart portions each comprising a metal positioned on a self-assembled monolayer (SAM) on the substrate, wherein the SAM is positioned between the metal and the substrate, wherein the spaced apart portions include a first portion and a last portion;
a signal-in section electrically coupled to the first portion;
a signal-out section electrically coupled to the last portion;
a first feature electrically coupled to the signal-in section;
a second feature electrically coupled to the signal-out section;
wherein the first feature is positioned on the substrate in the absence of a SAM between the first feature and the substrate; and
wherein the second feature is positioned on the substrate in the absence of a SAM between the second feature and the substrate.

8. The device of claim 7, further comprising a ground plane layer embedded in the substrate.

9. The device of claim 8, wherein the ground plane layer is positioned under the filter.

10. The device of claim 7, further comprising a dielectric layer positioned on and between the spaced apart portions of the filter on the substrate, wherein the spaced apart portions of the filter are each positioned between the dielectric layer and the SAM along a length of each of the spaced apart portions.

11. The device of claim 7, further comprising a dielectric layer positioned between the spaced apart portions of the filter on the substrate.

12. The device of claim 7, further comprising a dielectric layer positioned between the spaced apart portions of the filter on the substrate, wherein the dielectric layer comprises a solder mask material.

13. The device of claim 7, wherein the SAM comprises an organosilicon compound.

14. A device comprising:
a substrate;
an inductor positioned on a surface of the substrate, the inductor including a plurality of turns and a region between the turns, the inductor comprising a metal positioned on a self-assembled monolayer (SAM) on the substrate, wherein the SAM is positioned between the metal and the substrate; and
a dielectric layer positioned between the turns of the inductor;
wherein the dielectric layer is positioned on the substrate in the absence of a SAM therebetween in the region between the turns of the inductor.

15. The device of claim 14, wherein the inductor comprises a rectangular shaped spiral inductor.

16. The device of claim 14, wherein the dielectric layer is further positioned to extend above the inductor.

17. The device of claim 14, further comprising a ground plane layer embedded in the substrate.

18. The device of claim 17, wherein the ground plane layer is positioned under the inductor.

19. The device of claim 14, wherein the dielectric layer comprises a solder mask material.

20. The device of claim 14, wherein the SAM comprises an organosilicon compound.

* * * * *